United States Patent [19]

Hattori et al.

[11] Patent Number: 5,496,748
[45] Date of Patent: Mar. 5, 1996

[54] METHOD FOR PRODUCING REFRACTORY METAL GATE ELECTRODE

[75] Inventors: Ryo Hattori; Yasutaka Kohno, both of Itami, Japan

[73] Assignee: Mitsubishi Denki Kabushiki Kaisha, Tokyo, Japan

[21] Appl. No.: 304,852

[22] Filed: Sep. 13, 1994

[30] Foreign Application Priority Data

Sep. 20, 1993 [JP] Japan .................................. 5-232125

[51] Int. Cl.⁶ ...................... H01L 21/265; H01L 21/338
[52] U.S. Cl. ................. 437/40; 437/39; 437/175; 437/177; 437/179; 437/184; 437/190; 437/912
[58] Field of Search ................................. 437/40, 41, 44, 437/175, 176, 177, 178, 179, 184, 190, 912, 39

[56] References Cited

U.S. PATENT DOCUMENTS

| | | | |
|---|---|---|---|
| 4,213,840 | 7/1980 | Omori et al. | 204/192 |
| 4,977,100 | 12/1990 | Shimura | 437/912 |
| 5,041,393 | 8/1991 | Ahrens et al. | 437/912 |

FOREIGN PATENT DOCUMENTS

| | | |
|---|---|---|
| 62196873 | 8/1987 | European Pat. Off. . |
| 62283673 | 12/1987 | European Pat. Off. . |
| 64001278 | 1/1989 | European Pat. Off. . |
| 1244667 | 9/1989 | European Pat. Off. . |
| 3148837 | 6/1991 | European Pat. Off. . |
| 592064 | 4/1993 | European Pat. Off. . |
| 61-134072 | 6/1986 | Japan . |
| 5-102524 | 4/1993 | Japan . |

OTHER PUBLICATIONS

Onodera et al, "A 630–mS/mm GaAs MESFET with Au/WSiN Refractory Metal Gate," IEEE Electron Device Letters, 1988, Aug., 417–418.

Primary Examiner—Tuan H. Nguyen
Attorney, Agent, or Firm—Leydig, Voit & Mayer

[57] ABSTRACT

A method for producing a refractory metal gate electrode includes forming a patterning mask layer that is dissolved in a solution including hydrogen ions and having an aperture on a semiconductor substrate; forming a gate metal layer having an ionization potential larger than hydrogen on the entire surface of the patterning mask layer; forming a low resistance metal layer of a predetermined configuration having an ionization potential smaller than hydrogen on the gate metal layer; covering at least an upper surface of the low resistance metal layer with a film that has no reductive reaction with a solution including hydrogen ions; and removing the patterning mask layer using a solution including hydrogen ions after patterning the gate metal layer. An electrolytic reaction of a system including the gate metal layer, the low resistance metal layer, and the solution including hydrogen ions is suppressed by a film covering at least an upper surface of the low resistance metal layer, and localized abnormal dissolution of the gate metal when removing the patterning mask layer using the solution including the hydrogen ions is suppressed.

15 Claims, 7 Drawing Sheets

METHOD FOR PRODUCING REFRACTORY METAL GATE ELECTRODE

FIELD OF THE INVENTION

The present invention relates to a method for producing a refractory metal gate electrode and, more particularly, to a method for producing a high reliability gate electrode of a high output FET employing compound semiconductor,

BACKGROUND OF THE INVENTION

FIGS. 7(a) and 7(b) show cross-sectional structures of a GaAs MESFET having a T-shaped refractory metal gate electrode with a Au/TiN/WSi laminated layer structure produced by a conventional process flow. In the figures, reference numeral 1 designates a semi-insulating GaAs substrate on which an n type GaAs active layer 2 having a gate recess 5 of a predetermined depth is formed. In the gate recess 5 a Schottky junction type refractory metal gate 100 having a T-shaped cross section is disposed, and a source electrode 3 and a drain electrode 4 are disposed on the n type GaAs active layer 2 at opposite sides of the gate recess 5.

The refractory metal gate 100 is a laminated layer structure comprising a WSi film 8 1000 Å thick as a lower layer including a stem part 8' of a T-shaped configuration, a TiN film 9 as a plating feeding layer, and an Au plating layer 11 4000 Å thick. The WSi film 8 and the Au plated layer 11 respectively serve as a Schottky metal layer and a low resistance metal layer forming the Schottky junction type gate 100.

The process flow for fabricating the refractory metal gate electrode 100 will be described with reference to FIGS. 6(a)–6(g).

First of all, a gate recess 5 of a predetermined thickness is formed at a position between the source electrode 3 and the drain electrode 4 on the n type GaAs active layer 2 (FIG. 6(a)), and a spacer film comprising SiO 6 about 5000 Å thick is formed on the entire surface (FIG. 6(b)).

A photoresist (not shown) having an opening with a width of about 0.4 μm corresponding to a gate length is formed on the SiO spacer film 6, and a gate contact hole 7 of a depth reaching the surface of the n type GaAs active layer 2 is formed at a predetermined position of the SiO spacer film 6 corresponding to the center of the gate recess 5 by RIE Reactive Ion Etching) employing a gas including fluorine (FIG. 6(c)), and, a WSi film 8 and a TiN film 9 are successively deposited on the entire surface of the SiO spacer film 6 having the gate contact hole 7 by sputtering (FIG. 6(d)).

A resist pattern 10 having an opening 10a of a predetermined size is formed, and an Au plated layer 11 is formed through the opening 10a by Au electrolytic plating employing the TiN film 9 as a plating feeding layer (FIG. 6(e)).

Subsequently, the Au plating resist pattern 10 is removed with an organic solvent, and the TiN layer 9 and the WSi layer 8 are removed by patterning to leave a gate finger configuration by dry etching employing the Au plated layer 11 as a mask (FIG. 6(f)).

Finally, the SiO spacer film 6 is removed employing an HF series etching solution (FIG. 6(g)), thereby forming the Au/TiN/WSi gate electrode 100 having a T-shaped configuration. The step of removing the SiO spacer film 6 with an HF solution is indispensable to reduce the gate parasitic capacitance occurring between the head portion of a T-shaped configuration and the surface of the n type GaAs active layer 2. The reduction in the gate parasitic capacitance is required for enhancing high frequency characteristics.

In the prior art method for producing the refractory metal gate electrode described above, the T-shaped Au/TiN/WSi gate electrode 100 is quite thermally stable at the junction between the WSi film 8 and the n type GaAs active layer 2, and therefore, it has a high reliability. In addition, the refractory metal gate electrode has a T-shaped configuration so as to have a short gate length of about 0.3 μm and has the Au plated layer 11 at its upper part to have a greatly reduced gate resistance it can achieve a superior high frequency characteristics even with a short gate length. In this prior art method of production of a refractory metal gate electrode, however, when forming the WSi film 8 by sputtering, silicon is segregated at the side wall 7a of the gate contact hole 7 having a narrow concave part of a width of less than 1 μm and a depth of more than 0.1 μm. The silicon composition ratio abnormally increases as compared with the flat part and, therefore, when removing the SiO spacer film 6 employing an HF series etching solution, the WSi film 8 formed at the side wall part 7a corresponding to the stem part 8' of the T-shaped gate electrode 100 is easily dissolved in the HF series etching solution. Furthermore, at the interface between the WSi film 8 and the HF series etching solution, the oxidation reaction represented by the following formula occurs.

$$W+3H_2O \rightarrow WO_3+6H^++6e^-$$

Due to this oxidation reaction, electrons are released by tungsten and silicon is dissolved into the HF series etching solution from the WSi film 8. Those electrons are supplied to the reduction reaction occurring at the interface between the Au plated layer 11 and the HF series etching solution through the TiN film 9 and the Au plated layer 11 from the WSi film 8, the reduction reaction being represented by the following formula.

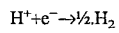

$$H^++e^- \rightarrow \tfrac{1}{2}H_2$$

Thereby, the WSi film 8 and the Au plated layer 11 respectively serve as electrodes, and the above described system comprising HF solution|WSi|Au|HF solution serves as a battery. This battery produces an electrolytic reaction that accelerates the dissolving of the WSi film 8 formed at the above-described side wall 7a into the HF series etching solution.

When the WSi film 8 and the Au film 11 are separately formed on the insulating film, are soaked in HF solution, and the electro-motive force arising between them is measured, an electro-motive force of about 0.33 V is generated, which is approximately equal to the reduction potential of tungsten, showing that an electrolytic reaction is generated by the WSi|HF solution|Au system.

The refractory metal gate electrode 100 which causes the above described battery reaction and segregation of silicon in its production process, unfavorably forms locally dissolved portions 12 and 13 at the stem part 8'. In observing the refractory metal gate electrode 100 in cross section by FIB (focused ion beam), it is found that a missing portion 12a due to localized dissolution, or an abnormally etched portion 13a of the WSi film 8 are produced as shown in FIG. 7(b). Such abnormal dissolution of WSi film 8 causes reattaching of the dissolved tungsten to the surface of the recess 5, and loss of the WSi film 8 of the remaining head portion of a T-shaped configuration to the surface of wafer, thereby causing various problems such as deterioration of the device operation characteristics or a reduction in reliability. Furthermore, the tungstic acid which is produced by tungsten being dissolved into the HF series etching solution will cause, if it includes ammonium ion or alkaline metal ion in its solution, precipitation of a tungstate such as $(NH_4)_2WO_4$, or $Na_2WO_4$ in the vicinity of the gate electrode 100 after water washing and drying, thereby resulting in characteristic deterioration and reduction in reliability due to metal contamination.

SUMMARY OF THE INVENTION

It is an object of the present invention to provide a method for producing a refractory metal gate electrode that can suppress abnormal dissolution of the stem part of T-shaped WSi series refractory metal gate electrode due to HF series etching during the removal of the SiO spacer film in the production process of forming the gate electrode into a T-shaped configuration employing a gate contact hole provided at the SiO spacer film.

It is another object of the present invention to enhance the stabilization of the configuration of the gate electrode, and further to enhance the device characteristics, reliability, and production yield.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a method for producing a refractory metal gate electrode includes a process of forming a patterning mask layer that is dissolved by a solution including hydrogen ions and having a predetermined aperture on a semiconductor substrate, a process of forming a gate metal layer having a larger ionization potential than hydrogen on the entire surface on the patterning mask layer, a process of forming a low resistance metal layer of a predetermined configuration having a smaller ionization potential on the gate metal layer, a process of covering at least an upper surface of the low resistance metal layer with a film in which no reductive reaction occurs with the solution including hydrogen ions before or after patterning the gate metal layer, and a process of removing the patterning mask layer using a solution including hydrogen ions after patterning the gate metal layer. Therefore, an electrolytic reaction of a system comprising the gate metal layer, the low resistance metal layer, and the solution including hydrogen ions can be suppressed by a film covering at least an upper surface of the low resistance metal layer, and the localized abnormal dissolution of the gate metal layer occurring when removing the patterning mask layer using the solution including hydrogen ions can be suppressed.

According to a second aspect of the present invention, a method for producing a gate metal electrode includes a process of coating the surface of a semiconductor by a silicon oxide film and forming an aperture of a predetermined size at a predetermined position, a process of forming a refractory metal film comprising WSiN on the silicon oxide film provided with the aperture, a process of forming an Au film of a predetermined pattern on the WSiN film directly or via a metal intermediate layer, and processing the WSiN film, or the metal intermediate layer and WSiN film into a predetermined configuration, a process of exposing the Au film to an organic solvent and covering the exposed surface with a film of a material at which no reductive reaction occurs upon contact with the HF series etching solution, a process of performing etching to remove the silicon oxide film with an HF series etching solution, and a process of removing the film of a material which has no reductive reaction at the contact surface with the HF series etching solution with an organic solvent. Therefore, the resistance to the HF series etching solution is improved at the WSiN film, and an electrolytic reaction of a system comprising HF solution|WSiN|Au|HF solution can be suppressed by a film covering an exposed surface of the Au film, whereby the silicon oxide film is etched and removed by the HF series etching solution. Further, localized abnormal dissolution of a stem part of a refractory metal gate electrode is suppressed, and stabilization of the electrode configuration and, improvements in device characteristics, in reliability, and in yield are realized.

A third aspect of the present invention, includes a process of coating the surface of a semiconductor by a silicon oxide film and forming an aperture of a predetermined size at a predetermined position, a process of forming a refractory metal film comprising WSiN on the silicon oxide film provided with the aperture, a process of forming an Au film of a predetermined pattern on the WSiN film directly or via a metal intermediate layer and processing a cap layer having a predetermined film thickness by employing a conducting metal which does not thermally react with Au and has no reduction reaction at the contact surface with HF series etching solution on an upper surface of the Au film, and a process of etching to remove the silicon oxide film with an HF series etching solution after processing the WSiN film or the metal intermediate layer and the WSiN film into predetermined configurations. Therefore, the resistance to the HF series etching solution is improved by the WSiN film, and a contact region of the Au film and the HF series etching solution on the cap layer formed on the Au film is reduced so that an electrolytic reaction in a system comprising HF solution|WSiN|Au|HF solution is suppressed and the silicon oxide film is etched and removed by the HF series etching solution. Thereby, a localized abnormal dissolution of a stem part of a refractory gate electrode is suppressed, and stabilization of the electrode configuration, and improvements in device characteristics, in reliability, and in yield can be realized.

According to a fourth aspect of the present invention, the process of performing etching to remove the silicon oxide film is performed employing a pure HF water solution including no ammonium ion or alkaline metal ion, thereby it is easily possible to carry out water washing after the process of gate electrode formation because there occurs no metal contamination due to reaction products of W dissolved during the etching being deposited or precipitated in the vicinity of the refractory gate electrode. Thereby, a method for producing a refractory metal gate electrode that can prevent deterioration in the device characteristics and enhance reliability is obtained.

DETAILED DESCRIPTION OF THE PREFERRED EMBODIMENTS

Embodiment 1

Figure 1:
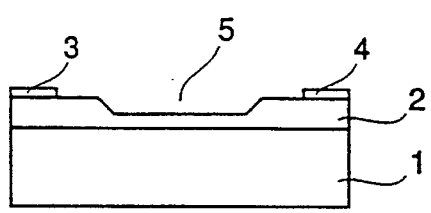
FIGS. 1(a)–1(i) are diagrams illustrating process steps for fabricating a refractory metal gate electrode according to a first embodiment of the present invention.
Figure 1:
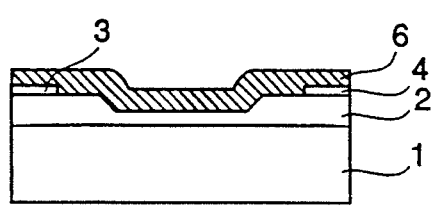
Figure 1:
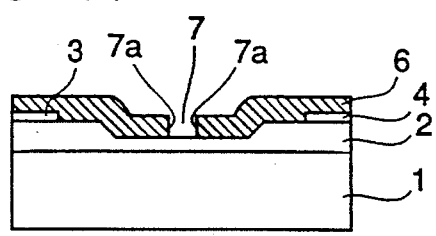
Figure 1:
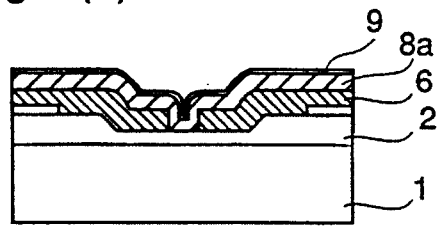
Figure 1:
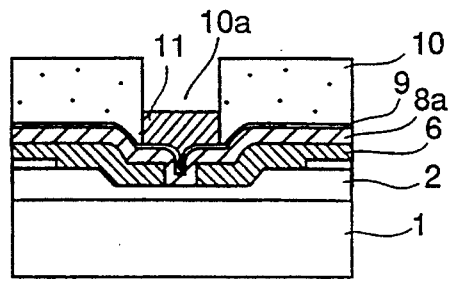
Figure 1:
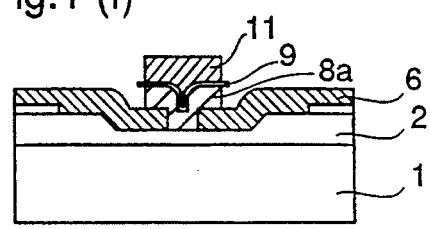
Figure 1:
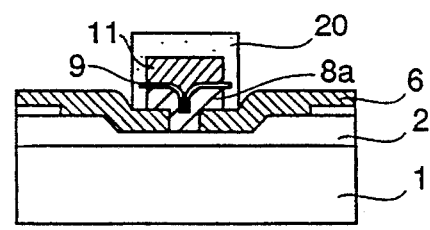
Figure 1:
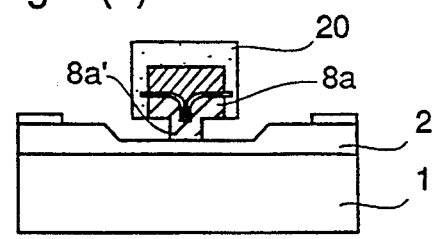
Figure 1:
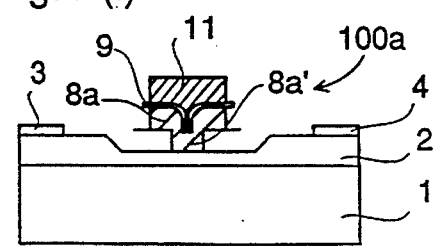
Figure 2:
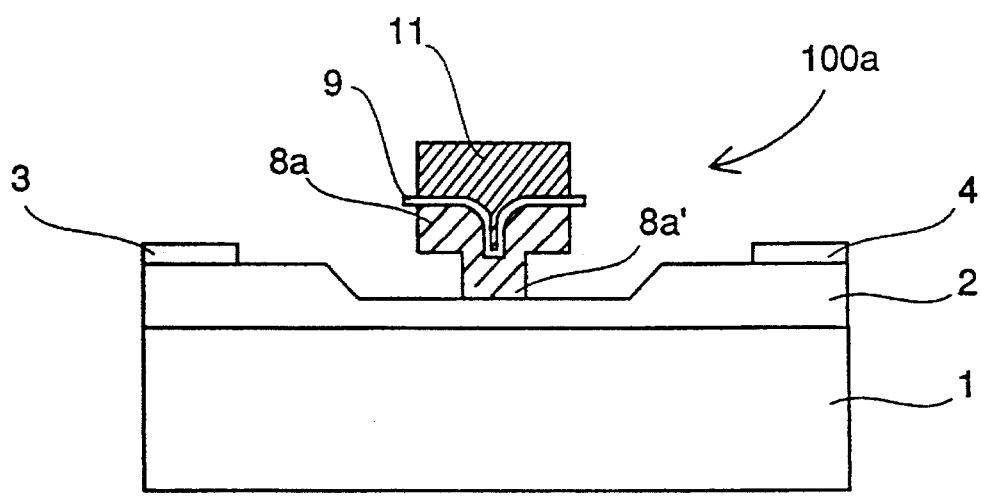
FIG. 2 is a cross sectional view illustrating a structure of a GaAs MESFET provided with a refractory metal gate electrode fabricated by the process steps according to the first embodiment.

FIGS. 1(a)–1(i) are diagrams illustrating process steps of a method for producing a refractory metal gate electrode according to a first embodiment of the present invention and, FIG. 2 illustrates a cross sectional structure of the GaAs MESFET having a T-shaped refractory metal gate electrode thus fabricated.

In the figures, reference numeral 100a designates a T-shaped refractory metal gate electrode disposed in the gate recess 5, and this has an Au/TiN/WSiN laminated layer structure. In this GaAs MESFET, the lower layer Schottky metal including a stem part 8a' of a T-shaped configuration of the gate electrode 100a comprises WSiN film 8a about 1000 Å thick, and the other construction is the same as that produced by the prior art method.

A description is given of the process flow for fabricating the refractory metal gate electrode.

First of all, a gate recess 5 of a predetermined depth is formed at a position between the source electrode 3 and the drain electrode 4 on the n type GaAs active layer 2 (FIG. 1(a)), and an SiO spacer film 6 about 5000 Å thick (a patterning mask for forming a T-shaped configuration) is formed on the entire surface (FIG. 1(b)).

Subsequently, a photoresist having an opening of about 0.4 μm widths corresponding to the gate length, is deposited over the SiO spacer film 6, and by performing an RIE using gas including fluorine, a gate contact hole 7 reaching the surface of the n type GaAs active layer 2 is formed at a predetermined position of the SiO spacer film 6 (FIG. 1(c)). Then, on the entire surface of the SiO spacer film 6 having the gate contact hole 7a, a WSiN film 8a is formed by reactive sputtering employing a plasma including $N_2$ gas and WSi as target and, subsequently a TiN film 9 serving as a metal intermediate layer is sputtered (FIG. 1(d)).

Figure 3:
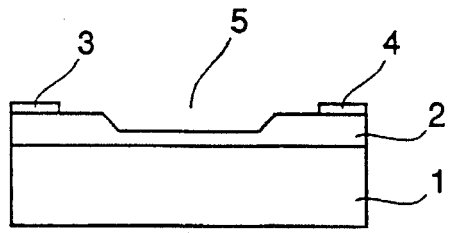
FIGS. 3(a)–3(g) are diagrams illustrating process steps for fabricating a refractory metal gate electrode according to a second embodiment of the present invention.
Figure 3:
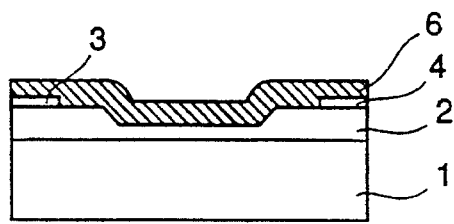
Figure 3:
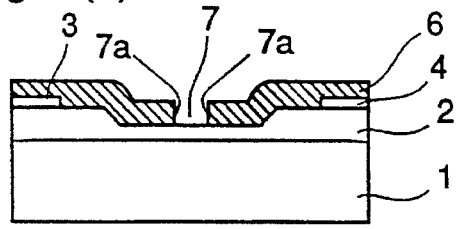
Figure 3:
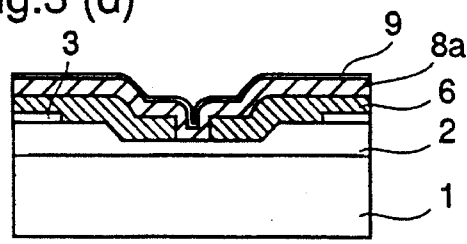
Figure 3:
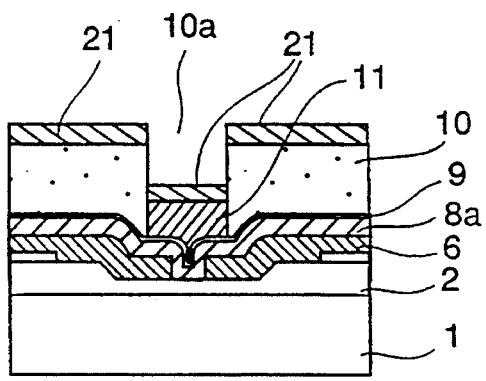
Figure 3:
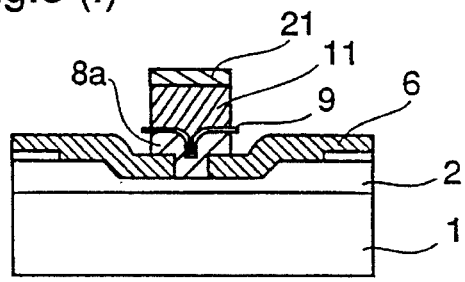
Figure 3:
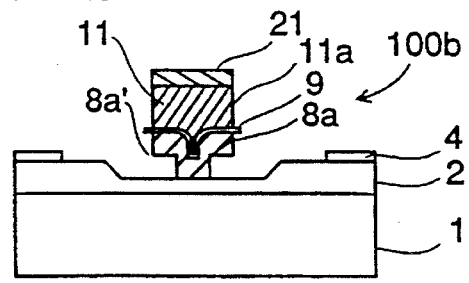

Although the segregation of silicon in the WSi film 8a at the side wall 7a of the gate contact hole 7 is not suppressed, the inter-molecule bonding force is strengthened by Si—N, or W—N bonds. Therefore, although in the prior art shown in FIG. 3 the WSi film 8 from which silicon is segregated as a mono-layer film would be dissolved into the HF series etching solution, the WSi film 8a in this embodiment would not be dissolved into the HF series etching solution even at the side wall 7a of a fine concave pattern of such as the gate contact hole 7 from which silicon is segregated.

Subsequently, a resist pattern 10 having an opening 10a of a predetermined size is formed, and an Au plated layer 11 is formed by electrolytic plating employing the TiN film 9 as a plating feeding layer through the opening 10a (FIG. 1(e)).

The Au plating resist pattern 10 is removed with an organic solvent, and thereafter the TiN layer 9 and the WSi film 8a are removed by a dry etching method using the Au plated layer 11 as a mask (FIG. 1(f)), and the exposed portion of the Au 11/TiN 9/WSiN 8a laminated layer film patterned into a gate finger configuration is coated with photoresist 20 (FIG. 1(g)), so that a reduction reaction occurring at the interface between the Au plated layer 11 and the HF series etching solution is prevented.

Thereafter, the SiO spacer film 6 is etched and removed by using the HF series etching solution (FIG. 1(h)).

Thereafter, the photoresist cover 20 is removed with an organic solvent (FIG. 1 (i)), and the Au/TiN/WSiN gate electrode 100a having a T-shaped configuration is formed.

In the method of production of the refractory metal electrode according to this first embodiment, since the WSiN film 8a is adopted as a material of the refractory metal gate, the resistance to the HF series etching solution is enhanced. Furthermore, because before removing the SiO spacer film 6 for forming the refractory metal gate electrode 100a in a T-shaped configuration using an HF series etching solution, the exposed surface of the Au plated layer 11 is covered by such as photoresist 20 so the Au plated layer 11 is not in direct contact with the HF series etching solution during the etching, a battery system is not formed, and the abnormal dissolution phenomenon at the stem part 8a' of a T-shaped refractory gate electrode 100a is prevented.

While in the above described first embodiment a TiN film serving as a metal intermediate layer 9 is formed between the Au plated layer 11 and the WSiN film 8a, this metal intermediate layer may be, for example, an Au film or a Ti film as the most appropriate material film in view of the production conditions. Further, although photoresist 20 is used to cover the exposed surface of the Au plated layer 11, any film that can be dissolved in an organic solvent and does not cause a reduction reaction at the contact surface with HF series etching solution may be employed with the same effects as described above.

Embodiment 2

A second embodiment of the present invention will be described with reference to the drawings.

Figure 4:
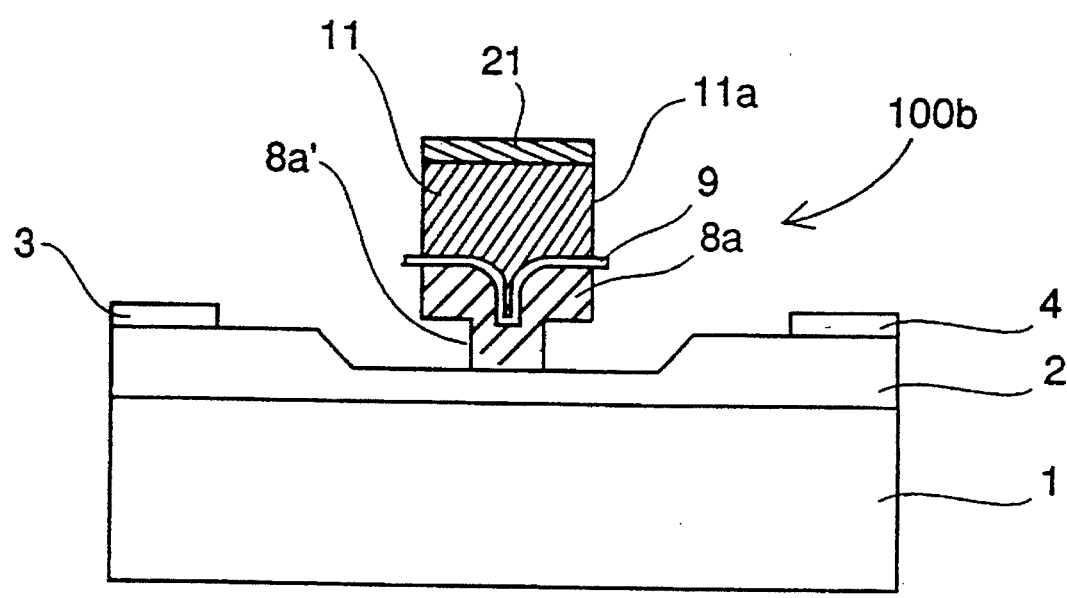
FIG. 4 is a cross sectional view illustrating a structure of a GaAs MESFET provided with a refractory metal gate electrode fabricated by the process steps according to the second embodiment.

FIGS. 3(a)–3(g) are a diagrams illustrating a process flow for producing a refractory metal gate electrode according to a second embodiment of the present invention. FIG. 4 is a cross sectional view illustrating a GaAs MESFET provided with a T-shaped refractory metal gate electrode produced by the process flow of this second embodiment.

In FIG. 4, the same reference numerals as those in FIG. 2 are used to designate the same or corresponding portions. Reference numeral 21 designates a WSiN cap layer formed on an upper surface of the Au plated layer 11. Reference numeral 100b designates a T-shaped refractory metal gate electrode having a laminated layer structure comprising a WSiN film 8a, a TiN film 9, an Au plated layer 11, and a WSiN cap layer 21.

The process flow for forming the refractory metal gate electrode 100b according to this second embodiment is the same up to the step shown in FIG. 3(d), sputtering the WSiN film 8a and the TiN film 9 as the step shown in FIG. 1(d) in the first embodiment. So the process flow after the step shown in FIG. 3(d) will be described.

First of all, in FIG. 3(e), a resist pattern 10 having an opening 10a of a predetermined size is formed, an Au plated layer 11 is formed by electrolytic plating employing the TiN film 9 as a feeding plated layer, and thereafter the WSiN cap layer 21 is formed by sputtering to a required thickness. Because the WSiN cap layer 21 is also etched in the subsequent step of FIG. 3(f), the thickness of the WSiN cap layer 21 when formed is required to be set so that a film thickness more than 10 nm remains even after the dry etching.

After removing the plating resist pattern 10 with an organic solvent, the TiN film 9 and the WSiN film 8a are removed by dry etching employing the WSiN cap layer 21 and the Au plated layer 11 as a mask (FIG. 3(f)).

Thereafter, the SiO spacer film 6 is etched and removed with an HF series etchant solution (FIG. 3(g)), thereby producing a WSiN/Au/TiN/WSiN gate electrode 100b of a T-shaped configuration.

Conventionally, there is an MOS type FET having a gate comprising a refractory metal and refractory metal silicide layers sandwiching the refractory metal disposed at its upper surface and rear surface, as disclosed in Japanese Published Patent Application No. sho. 61-134072. The technique disclosed in this publication, however, aims at obtaining a gate structure having a reduced gate resistance and superior in thermal resistance, chemical resistance, resistance to oxidation, and high frequency characteristics due to covering of the gate with a refractory metal silicide layer. Therefore, this is different from the second embodiment employing the refractory metal gate electrode 100b in which, in the production process of T-shaped WSi series refractory metal gate electrode having an Au plated layer 11 at its upper part and superior high frequency characteristics, a reduction reaction at an interface between the Au plated layer 11 and the HF series etchant solution of a battery system comprising HF solution|WSiN|Au|HF solution and abnormal dissolution of the stem part 8a' of the gate electrode due to an electrolytic reaction are suppressed by the WSiN cap layer 21 formed on the upper surface of the Au plated layer 11.

Japanese Published Patent Application No. Hei. 5-102524 discloses a semiconductor element in which an electrode provided on its semiconductor layer is covered by a material layer which is not eroded by an etching solution. However, the technique disclosed in this publication also aims at preventing the electrode from being eroded by the etching solution during wet etching for removing distortion at the dicing plane after dicing, thus preventing the peeling off of the electrode. This publication discloses covering the electrode with a material layer which is not eroded by the etching solution. Therefore, this technique is different from the second embodiment employing the refractory metal gate electrode 100b in which a reduction reaction at the interface between the Au plated layer 11 and the HF series etching solution and abnormal dissolution of the stem part 8a' of the gate electrode due to an electrolytic reaction are achieved by forming the WSiN cap layer 21 on the upper surface of the Au plated layer 11.

In the formation of a refractory metal gate electrode 100b of this second embodiment, since WSiN is employed as the material for forming the refractory metal gate, the resistivity against the HF series etching solution is improved, the WSiN cap layer 21 of a required film thickness is formed on the upper surface of the Au plated layer 11, the WSiN cap layer 21 is left in a predetermined thickness after dry etching of the TiN film 9 and the WSiN film 8a, and the SiO spacer film 6 is removed by the HF series etching solution. Therefore, although the side wall part 11a of the Au plated layer 11 is in contact with the HF series etching solution during the etching of the SiO spacer film 6 (FIG. 3(g)), the contact area is limited to a great extent by forming the WSiN cap film 21, and the effect of a battery system comprising HF solution|WSiN|Au|HF solution is suppressed. Furthermore, by the dissolution of W and Si from the WSiN cap layer 21 being added to the dissolution of the W and Si of the WSiN film 8a into the HF series etchant solution, whereby the effect of the battery system is further suppressed and abnormal dissolution of the WSiN film 8a at the stem part 8a' in a T-shaped configuration gate electrode 100b is reduced. In addition, since the cap layer 21 employing refractory metal WSiN is used in this second embodiment, the WSiN cap layer 21 can be used as a barrier layer in a later process, whereby the mixing of the Au plated layer 11 and the wiring metal laminated thereon is prevented.

While in the above described second embodiment a cap layer 21 comprising WSiN is provided to reduce the contact area between the Au plated layer 11 and HF series etching solution, the cap layer is not limited to WSiN, and another refractory metal such as WSi, W, and Mo may be employed with the same effects. Furthermore, a conductive metal that does not thermally react with Au and does not produce a reductive electrode reaction at the contact surface With the HF series etching solution, may be employed to suppress the above described abnormal dissolution phenomenon.

Embodiment 3

FIGS. 5(a)–5(i) are diagrams illustrating a process flow for forming a refractory metal gate electrode according to a third embodiment of the present invention. In these figures, the same reference numerals as those in FIGS. 1(a)–1(i) are used to designate the same or corresponding portions. Reference numeral 11' designates an Au layer directly formed on the WSiN film 8a.

Figure 5:
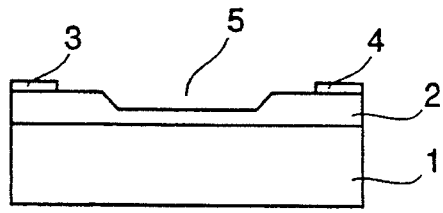
FIGS. 5(a)–5(i) are diagrams illustrating process steps for fabricating a refractory metal gate electrode according to a third embodiment of the present invention.
Figure 5:
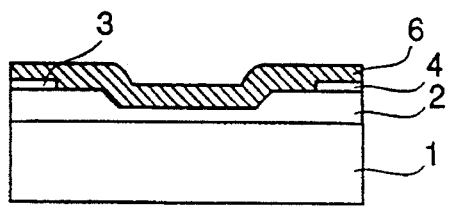
Figure 5:
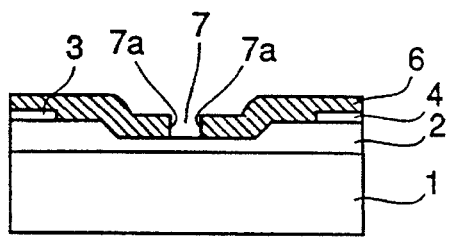
Figure 5:
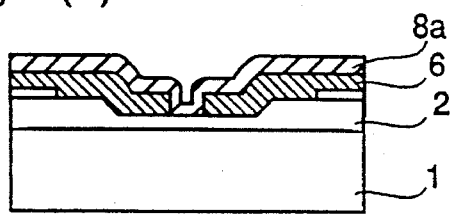
Figure 5:
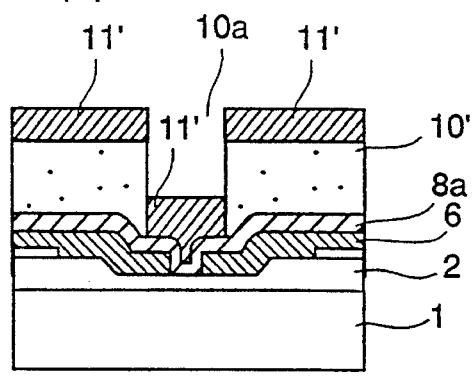
Figure 5:
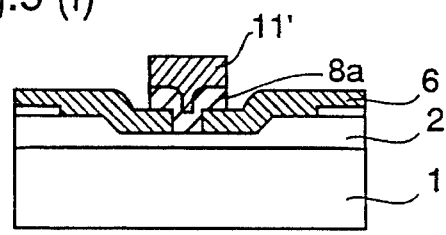
Figure 5:
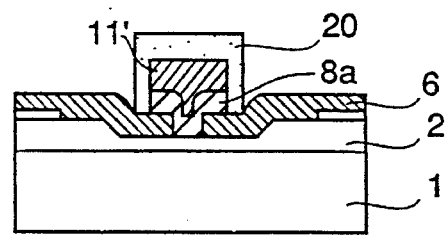
Figure 5:
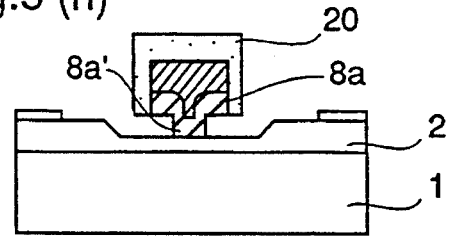
Figure 5:
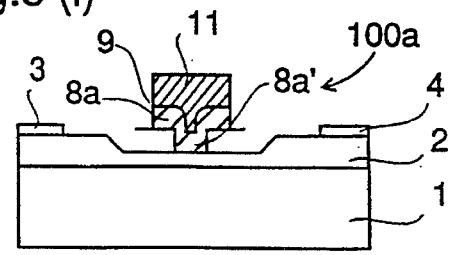
Figure 6:
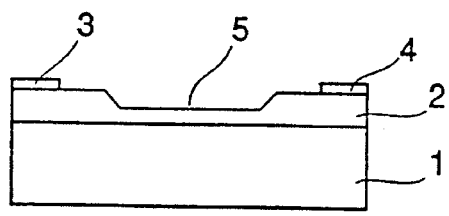
FIGS. 6(a)–6(g) are diagrams illustrating process steps for fabricating a refractory metal gate electrode according to the prior art.
Figure 6:
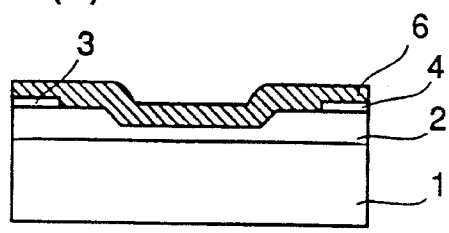
Figure 6:
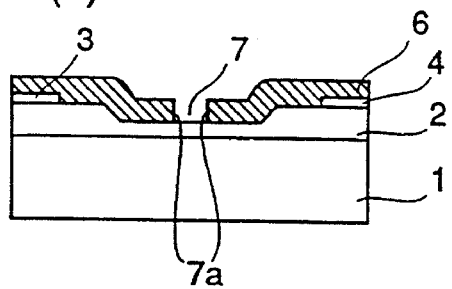
Figure 6:
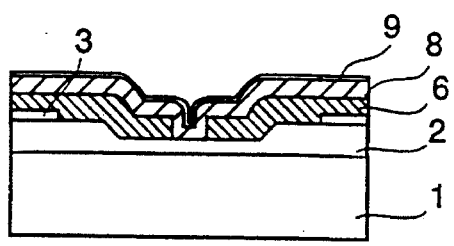
Figure 6:
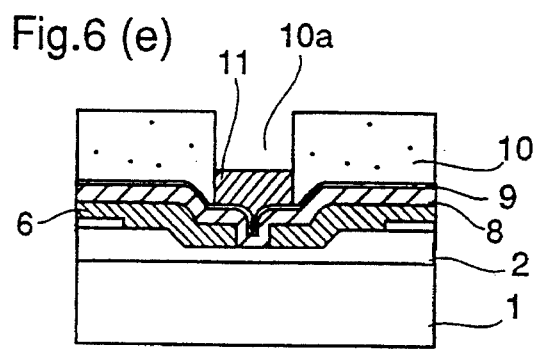
Figure 6:
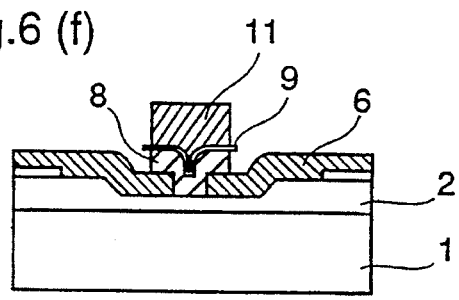
Figure 6:
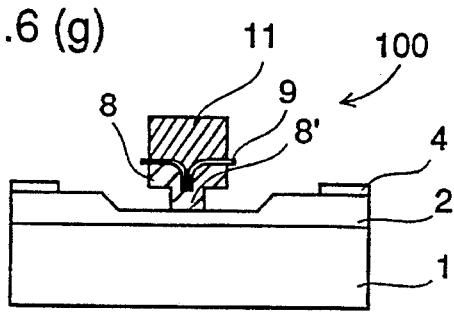
Figure 7:
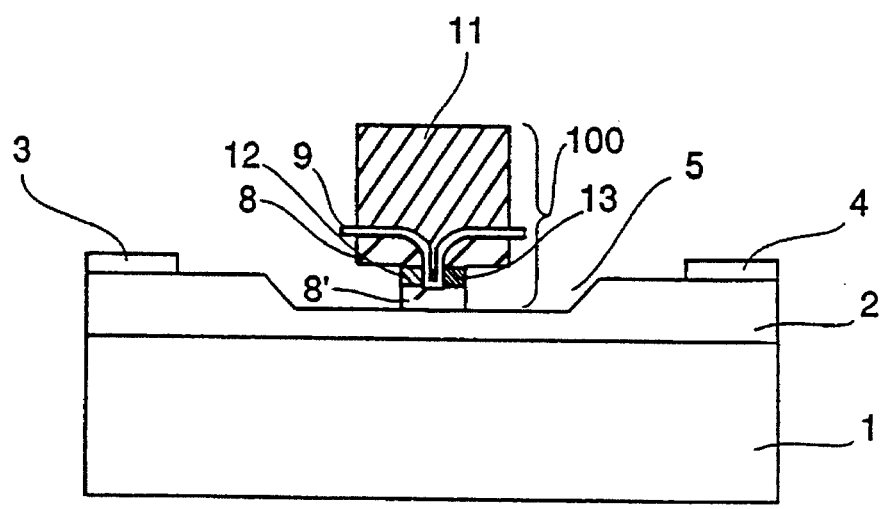
FIG. 7(a) is a cross sectional view illustrating a structure of a GaAs MESFET provided with a refractory metal gate electrode fabricated according to the prior art process flow and, FIG. 7(b) is a diagram illustrating dissolution of the stem part of the refractory metal gate electrode.
Figure 7:
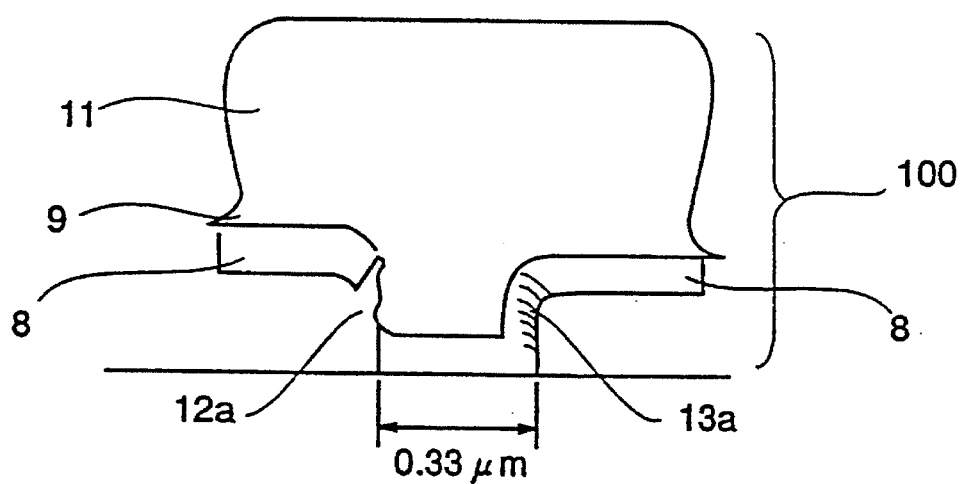

Although in the first embodiment a TiN film (metal intermediate layer) 9 is formed on the WSiN film 8a and Au plated layer 11 is formed by plating using the TiN film 9 as a feeding layer, in this third embodiment, after the WSiN film 8a is sputtered, the Au layer 11' is sputtered so as to have a predetermined configuration employing the mask 10' as shown in FIG. 5(e).

In addition, the Au layer 11' may be formed by vacuum evaporation in place of the sputtering method. Then, as in the process flow of the second embodiment, an Au layer 11' deposited by sputtering or vacuum evaporation may be formed in place of the Au plated layer 11.

Even by the method for forming the refractory metal gate electrode as described above, the same effects as those of the first and the second embodiments are obtained.

Embodiment 4

A fourth embodiment of the present invention employs a pure HF water solution including no ammonium ion or alkaline metal ion in place of the HF series etching solution at the etching removal of the SiO spacer film 6 in the step shown in FIG. 1(h) in the first embodiment or in the step shown in FIG. 2(g) in the second embodiment.

In forming a refractory metal gate electrode according to this fourth embodiment, in addition to an effect of suppressing abnormal dissolution, it is easily possible to carry out water washing after the process of gate electrode formation because there occurs no metal contamination in the vicinity of the gate electrode due to reaction products of W from the WSiN film 8a during the etching that are deposited or precipitated in the gate recess 5. Accordingly, an increase in the leakage current and a reduction in the gate breakdown voltage due to the metal contamination are suppressed, deterioration in the device characteristics is prevented and the reliability of the device is enhanced.

As is evident from the foregoing description, according to a present invention, a method for forming a Schottky junction type refractory metal gate electrode having a predetermined configuration includes a process of forming a patterning mask layer which is soluble in a solution including hydrogen ions and has a predetermined aperture on a semiconductor substrate, a process of forming a gate metal layer having an ionization potential larger than that of hydrogen on the entire surface of the patterning mask layer, a process of forming a low resistance metal layer having an ionization potential smaller than that-of the gate metal layer and having a predetermined configuration, a process of covering at least an upper surface of the low resistance metal layer with a film that prevents a reductive reaction with the solution including hydrogen ion before or after the patterning the gate metal layer, and a process of removing the patterning mask layer employing a solution including hydrogen ions after patterning the gate metal layer. Therefore, a an electrolyte reaction of a system comprising the gate metal layer, the low resistance metal layer, and the solution including hydrogen ions can be suppressed by a film covering at least an upper surface of the low resistance metal layer, and localized abnormal dissolution at the gate metal layer which occurs when removing the patterning mask layer using the solution including the hydrogen ions, can be suppressed.

According to the present invention, a method of forming a Schottky junction type refractory metal gate electrode having a predetermined configuration includes a process of coating the surface of a semiconductor with a silicon oxide film, forming an aperture of a predetermined size at a predetermined position, a process of forming a refractory metal film comprising WSiN on the silicon oxide film provided with the aperture, a process of forming an Au film having a predetermined pattern on the WSiN film directly or via a metal intermediate layer, and processing the WSiN film, or the metal intermediate layer and WSiN film into predetermined configurations, a process of opposing the Au film by removing a photoresist film with an organic solvent and covering the exposed surface with a film of material at which no reductive reaction occurs upon contact with the HF series etching solution, a process of etching and removing the silicon oxide film with an HF series etching solution, and a process of removing a film of a material which has no a reductive reaction at the contact surface with the HF series etching solution with an organic solvent. Therefore, the resistance to the HF series etching solution is improved by the WSiN film, and an electrolytic reaction of a system comprising HF solution |WSiN|Au|HF solution is suppressed by a film covering the exposed surface of the Au film, whereby the silicon oxide film is etched and removed by the HF series etching solution. Further, localized abnormal dissolution at a stem part of a refractory metal gate electrode during this etching is suppressed, and a stable electrode configuration and device characteristics, and improvement in reliability and yield can be realized.

According to the present invention, a method of forming a Schottky junction type refractory metal gate electrode having a predetermined configuration includes a process of coating the surface of a semiconductor with a silicon oxide film and forming an aperture of a predetermined size at a predetermined position, a process of forming a refractory metal film comprising WSiN on the silicon oxide film provided with the aperture, a process of forming an Au film of a predetermined pattern on the WSiN film directly or via a metal intermediate layer and processing a cap layer having a predetermined film thickness by employing a conductive metal which does not thermally react with Au and has no reduction reaction upon contact with an HF series etching solution on an upper surface of the Au film, and a process of etching and removing the silicon oxide film with an HF series etching solution after processing the WSiN film or the metal intermediate layer and WSiN film into predetermined configurations. Therefore, the resistance to the HF series etching solution is improved by the WSiN film, and a contact region of the Au film and the HF series etching solution on the cap layer formed on the Au film is reduced so that an electrolytic reaction of a system comprising HF solution |WSin|Au|HF solution is suppressed and the silicon oxide film is etched and removed by the HF series etching solution. Thereby, localized abnormal dissolution occurring at a stem part of a refractory gate electrode during this etching is suppressed, and a stable electrode configuration, device characteristics, and improvements in reliability and yield can be realized.

According to the present invention, a process of etching and removing the silicon oxide film is performed employing a pure HF water solution including no ammonium ions or alkaline metal ions, whereby it is easily possible to carry water washing after forming the gate electrode because there is no metal contaminations due to that reaction products of W dissolved during the etching removal and deposited or precipitated in the vicinity of the refractory gate electrode. Thereby, a method for producing a refractory metal gate electrode preventing deterioration in the device characteristics and enhancing reliability can be obtained.

What is claimed is:

1. A method for producing a Schottky junction type refractory metal gate electrode having a configuration comprising:

forming a patterning mask layer that is soluble in a solution including hydrogen ions and that has an aperture on a semiconductor substrate;

forming a gate metal layer having an ionization potential larger than that of hydrogen on all of said patterning mask layer;

forming a second metal layer having an ionization potential smaller than that of hydrogen in a pattern on said gate metal layer;

before patterning said gate metal layer, covering part of an upper surface of said second metal layer with a film that does not produce a reduction reaction with the solution including hydrogen ions, leaving part of said second metal layer opposite the aperture exposed;

depositing a third metal layer on said second metal layer where said second metal layer is exposed;

uncovering the upper surface of said second metal layer not covered by said third metal layer and removing the parts of said second metal layer and said first metal layer thus uncovered, thereby exposing part of said patterning mask layer and patterning said gate metal layer, leaving a gate electrode;

covering said gate electrode with a second film that does not produce a reduction reaction with the solution including hydrogen ions;

removing said patterning mask layer employing the solution including hydrogen ions; and removing said second film.

2. A method for producing a Schottky junction type refractory metal gate electrode comprising:

coating a semiconductor surface with a silicon oxide film and forming an aperture in said silicon oxide film;

forming a refractory metal film comprising WSiN on said silicon oxide film including the aperture;

forming and patterning an Au film into a pattern on said WSiN film using a photoresist mask;

etching said WSiN film into a configuration after forming and patterning said Au film;

exposing said Au film with an organic solvent that disolves the photoresist mask and covering said Au film with a film of material that does not produce a reduction reaction upon contact with an HF solution;

etching and removing said silicon oxide film with an HF solution; and removing said film of material that does not produce a reduction reaction with the HF solution with the organic solvent.

3. The method for producing said refractory metal gate electrode of claim 2 including:

forming said WSiN film by sputtering;

forming a metal intermediate layer by sputtering TiN after forming said WSiN film; and plating said Au film employing said metal intermediate layer of TiN as a feeding layer.

4. The method for producing said refractory metal gate electrode of claim 2 including:

forming said WSiN film by sputtering; and forming said Au film by sputtering after sputtering said WSiN film.

5. The method for producing said refractory metal gate electrode of claim 2 including forming a metal intermediate layer on said WSiN film of one of Au and Ti.

6. The method for producing said refractory metal gate electrode of claim 2 including etching and removing said silicon oxide film employing a pure HF water solution including neither ammonium ion nor alkaline metal ion.

7. A method for producing a Schottky junction type refractory metal gate electrode comprising:

coating a semiconductor surface with a silicon oxide film and forming an aperture in said silicon oxide film;

forming a refractory metal gate film comprising WSiN on said silicon oxide film including the aperture;

forming an Au film in a pattern on said WSiN film and forming a cap layer of a conductive metal that does not thermally react with Au and does not produce a reduction reaction upon contact with an HF solution;

etching said WSiN film into a configuration; and etching and removing said silicon oxide film with the HF solution.

8. The method for producing said refractory metal gate electrode of claim 7 wherein said cap layer is a refractory metal including one of tungsten and molybdenum.

9. The method for producing said refractory metal gate electrode of claim 8 wherein said cap layer comprises a material selected from the group consisting of WSiN, WSi, W, and Mo.

10. The method for producing said refractory metal gate electrode of claim 7 including:

forming said WSiN film by sputtering;

forming a metal intermediate layer by sputtering TiN after forming said WSiN film; and plating said Au film employing said metal intermediate layer of TiN as a feeding layer.

11. The method for producing said refractory metal gate electrode of claim 7 including:

forming said WSiN film by sputtering; and forming said Au film by sputtering after sputtering said WSiN film.

12. The method for producing said refractory metal gate electrode of claim 7 including forming said cap layer by one of vacuum evaporation and sputtering.

13. The method for producing said refractory metal gate electrode of claim 7 including forming a metal intermediate layer on said WSiN film of one of Au and Ti.

14. The method for producing said refractory metal gate electrode of claim 7 including etching and removing said silicon oxide film employing a pure HF water solution including neither ammonium ion nor alkaline metal ion.

15. A method for producing a Schottky junction type refractory metal gate electrode having a configuration comprising:

forming a patterning mask layer that is soluble in a solution including hydrogen ions and that has an aperture on a semiconductor substrate;

forming a gate metal layer having an ionization potential larger than that of hydrogen on all of said patterning mask layer;

before patterning said gate metal layer, covering part of an upper surface of said gate metal layer with a film that does not produce a reduction reaction with the solution including hydrogen ions, leaving part of said gate metal layer opposite the aperture exposed;

depositing a second metal layer on said gate metal layer where said gate metal layer is exposed;

uncovering the upper surface of said gate metal layer not covered by said second metal layer and removing the parts of said gate metal layer thus uncovered, thereby exposing part of said patterning mask layer and patterning said gate metal layer, leaving a gate electrode;

covering said gate electrode with a second film that does not produce a reduction reaction with the solution including hydrogen ions;

removing said patterning mask layer employing the solution including hydrogen ions; and removing said second film.

* * * * *